United States Patent
Murase et al.

(10) Patent No.: US 8,072,026 B2
(45) Date of Patent: Dec. 6, 2011

(54) SEMICONDUCTOR DEVICE AND METHOD FOR MANUFACTURING THE SAME

(75) Inventors: Yoshimitsu Murase, Kanagawa (JP);
Kenya Kobayashi, Kanagawa (JP);
Hideo Yamamoto, Kanagawa (JP);
Atsushi Kaneko, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/659,454

(22) Filed: Mar. 9, 2010

(65) Prior Publication Data

US 2010/0171172 A1    Jul. 8, 2010

Related U.S. Application Data

(62) Division of application No. 11/984,043, filed on Nov. 13, 2007, now Pat. No. 7,704,827.

(30) Foreign Application Priority Data

Dec. 8, 2006   (JP) .................................. 2006-331619

(51) Int. Cl.
*H01L 29/76* (2006.01)
*H01L 29/94* (2006.01)
*H01L 31/113* (2006.01)
*H01L 31/119* (2006.01)
*H01L 29/00* (2006.01)

(52) U.S. Cl. ................. 257/330; 257/510; 257/E29.262

(58) Field of Classification Search .................. 438/247, 438/248; 257/510, 330, E29.262
See application file for complete search history.

(56) References Cited

U.S. PATENT DOCUMENTS

| | | | |
|---|---|---|---|
| 6,351,009 B1 | 2/2002 | Kocon et al. | |
| 6,403,432 B1 | 6/2002 | Yu et al. | |
| 6,495,421 B2 | 12/2002 | Luo | |
| 7,674,685 B2 * | 3/2010 | Choi et al. | 438/427 |
| 2002/0119639 A1 * | 8/2002 | Ridley et al. | 438/428 |
| 2006/0205222 A1 | 9/2006 | In't Zandt et al. | |
| 2007/0072387 A1 * | 3/2007 | Lai et al. | 438/424 |
| 2008/0166854 A1 * | 7/2008 | Shin et al. | 438/427 |

FOREIGN PATENT DOCUMENTS

| | | |
|---|---|---|
| JP | 2000-252468 | 9/2000 |
| JP | 2001-36074 | 2/2001 |
| JP | 2003-101027 | 4/2003 |
| JP | 2005-86140 | 3/2005 |

* cited by examiner

*Primary Examiner* — David S Blum
(74) *Attorney, Agent, or Firm* — McGinn IP Law Group, PLLC

(57) ABSTRACT

A semiconductor device, includes a semiconductor layer of a second conductive type, a first diffused region of a first conductive type formed in the semiconductor layer, a second diffused region of the second conductive type selectively formed in the first diffused region, a trench formed in the semiconductor layer, a polysilicon formed in the trench with an insulator intervening, a first oxide film formed on the polysilicon so that the first oxide film is buried in the trench, a second oxide film formed on the first oxide film so that the second oxide film is buried in the trench, and a flowable insulator film formed on the second oxide film so that the flowable insulator film is buried in the trench.

20 Claims, 5 Drawing Sheets

SEMICONDUCTOR DEVICE AND METHOD FOR MANUFACTURING THE SAME

The present Application is a Divisional Application of U.S. patent application Ser. No. 11/984,043, now U.S. Pat. No. 7,704,827, filed on Nov. 13, 2007, and which claims priority from Japanese Patent Application No. 2006-331619, filed on Dec. 8, 2006, the entire contents of which are incorporated herein by reference.

BACKGROUND OF THE INVENTION

1. Field of the Invention

This invention relates to a semiconductor device and a method for manufacturing semiconductor device. Particularly, the present invention relates to a vertical MOSFET having a trench gate electrode and a method for manufacturing the same.

2. Description of Related Art

With rapid development of microfabrication technology, a semiconductor device continues to be integrated highly. Especially, it is well known that a vertical MOSFET (UMOSFET) having a gate electrode buried in a trench has low on-resistance and high breakdown voltage. Further, high integration is required for lower on-resistance and cost reduction (Japanese Unexamined Patent Application Publication No. 2005-86140 and No. 2001-36074). As one of methods for high integration, it is known that the gate trench is formed deeply in an epitaxial layer so as to shorten an aperture of the gate trench. For another method, it is known that an interlayer insulator is buried completely in the gate trench to shorten the aperture of the trench (Japanese Unexamined Patent Application Publication No. 2003-101027, No. 2000-252468 and U.S. Pat. No. 6,351,009).

Hereinafter, a related manufacturing process of UMOSFET, having the interlayer insulator buried in the gate trench completely, will be described. An N-channel type of UMOSFET is taken for instance. As shown in FIG. 9, an n– type epitaxial layer 82 is formed on a semiconductor substrate 81 by an epitaxial growth. A gate trench 83 is formed to the surface of the n– type epitaxial layer 82 so that the gate trench 83 reaches to the inner of the n– epitaxial layer 82. A gate insulator 84 is formed on the inner side of the gate trench 83. Further, a polysilicon 85 as a gate electrode is buried in the gate trench 83 with the gate insulator interposed therebetween. A high temperature oxide film (an HTO film) 86 is formed on the polysilicon 85 and the surface 82a of the n– type epitaxial layer.

A p type diffused base layer 87 and an n+ type diffused source layer 88 are formed on the surface 82a of the n– type epitaxial layer with ion implantation doping though the HTO film 86. A boron phosphorus silicate glass film (a BPSG film) 89 is formed on the HTO film 86. The BPSG film 89 has a flowability. Hence, the surface of the BPSG film 89 is planarized by a heat treatment after forming the BPSG film 89. An etch-back process is performed from the surface of the planarized BPSG film 89 to the depth of an aperture of the gate trench. So, the HTO film 86 and the BPSG film 89 formed on the n-type epitaxial layer 82 are removed. As shown in FIG. 10, a source electrode is formed on the entire surface of the semiconductor device. A drain electrode 91 is formed on the back side of semiconductor substrate 81. Hence, the cell pitch can be reduced, because the interlayer insulator (the BPSG film 89) between the gate electrode (the polysilicon 85) and the source electrode 90 is buried wholly in the gate trench 83.

In the UMOSFET configured as described above, the polysilicon 85 as the gate electrode is positioned in the lower portion of the gate trench 83. It is because the BPSG film 89 as the interlayer insulator is buried in the gate trench completely. Hence, it needs to form the n+ type diffused source layer 88 in the lower portion of the gate trench 83 depending on the position of the polysilicon 85. The process of heat treatment to planarize the BPSG film 89 includes the process to diffuse the n+ type diffused source layer 88 also in order to reduce number of process. Here, this process needs high temperature as to diffuse the n+ diffused source layer 88 sufficiently. However, the thickness of the HTO film 86 between the BPSG film 89 and the n– type epitaxial layer 82 is formed to be thin. It is because the p type diffused base layer 87 and the n+ type diffused source layer 88 are formed by ion implantation doping though the HTO film 86 as described above. Hence, if the heat treatment to planarize the BPSG film 89 is set to be high temperature, the diffusion of boron and phosphorus from the BPSG film 89 to the n-type epitaxial layer 82 is promoted. So, it makes the controllability of the manufacturing the semiconductor device worse.

In this way, the UMOSFET having the interlayer insulator buries in the gate trench has the process lower controllability, because impurity like boron and phosphorus diffuse from the BPSG film at the heat treatment.

SUMMARY

According to one aspect of this invention, there is provided a method for manufacturing a semiconductor device comprising: forming a first oxide film on a surface of a semiconductor layer and a polysilicon in a trench, the trench formed in the semiconductor layer; forming a first diffused layer of a first conductivity type and a second diffused layer of a second conductivity type through the first oxide film; forming a second oxide film on the first oxide film; forming a flowable insulator film on the second oxide film; performing a heat treatment for planarizing the insulator film and diffusing the second diffused layer to prescribe depth; and etching the insulator film.

According to another aspect of this invention, there is provided a semiconductor device comprising: a semiconductor layer of a second conductive type; a first diffused region of a first conductive type formed in the semiconductor layer; a second diffused region of the second conductive type selectively formed in the first diffused region; a trench formed in the semiconductor layer; a polysilicon formed in the trench with an insulator intervening; a first oxide film formed on the polysilicon so that the first oxide film is buried in the trench; a second oxide film formed on the first oxide film so that the second oxide film is buried in the trench; a flowable insulator film on the second oxide film.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
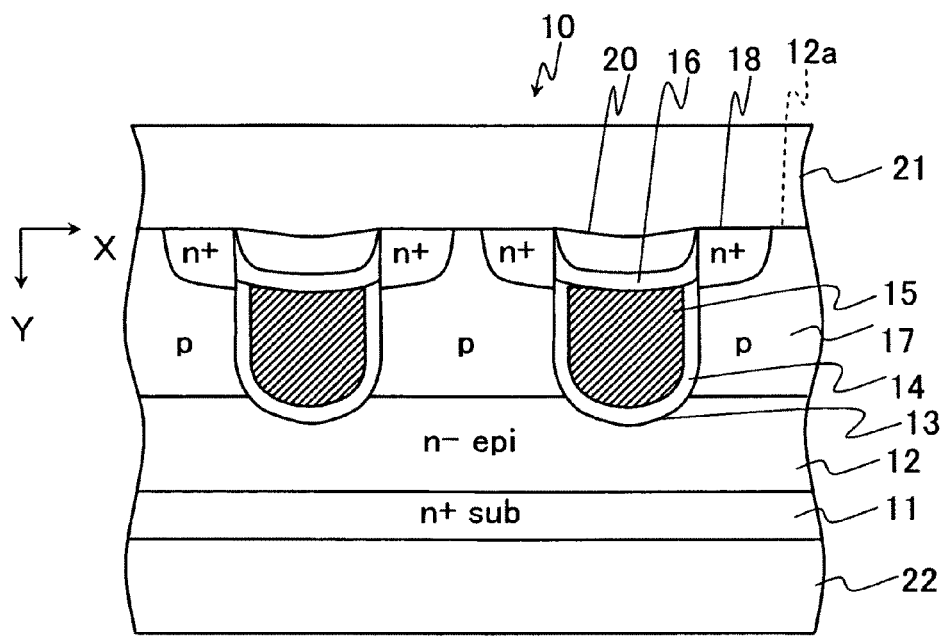
FIG. 1 shows a cross sectional view of the semiconductor device 10 according to a first embodiment.

FIG. 1 shows a cross sectional view of a semiconductor-device according to a first embodiment of the invention. Hereinafter, "n+" means n type semiconductor which n type impurity heavily doped. "n–" means n type semiconductor which n type impurity lightly doped. Likewise, "p+" means p type semiconductor which p type impurity heavily doped. "p–" means p type semiconductor which p type impurity lightly doped. "X direction" means a horizontal direction of drawing sheet and "Y direction" means a vertical direction of drawing sheet.

As shown in FIG. 1, a semiconductor device 10 comprises an n+ type semiconductor substrate 11. An n– type epitaxial layer 12 is formed on the n+ type semiconductor substrate 11. A p type diffused base layer 17 (a first diffused layer) is formed on the n– type epitaxial layer 12. A gate trench 13 is formed on the surface of the p diffused base layer. A plurality of the gate trenches 13 are formed in the X direction. A bottom of the gate trench 13 reaches to the n– epitaxial layer 12. A gate insulator 14 is formed on an inner wall of the gate trench 13. A polysilicon 15 is formed on an inner aspect of the gate insulator 14. The HTO film 16 (a first oxide film) is formed in a lower portion in the Y direction than a surface of p type diffused base layer on the polysilicon 15. A chemical vapor deposition oxide film (a CVD oxide film) 20 (a second oxide film) is formed so that the CVD oxide film 20 reaches around an aperture of the gate trench 13. Beside the aperture of the gate trench 13, an n+ type diffused source layer 18 (a second diffused layer) is formed. A source electrode 21 is formed on the n+ type diffused source layer 18. The source electrode 21 is connected electrically to the n+ type diffused source layer 18 and the p type diffused base layer 17. A drain electrode 22 is formed on the backside of the n+ type semiconductor substrate 11.

Figure 2:
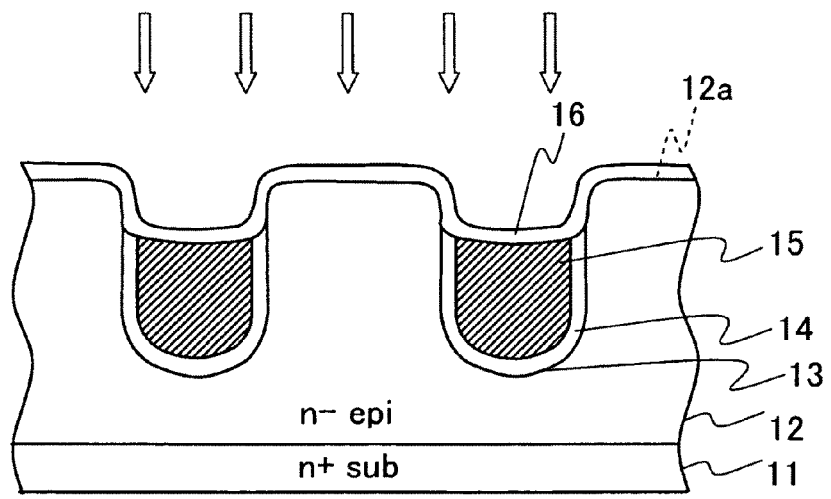
FIG. 2 shows the first process of forming the semiconductor device 10.

Next, a method for manufacturing the semiconductor device 10 configured as above is explained hereinafter. FIG. 2 shows a first process for manufacturing semiconductor device 10. Firstly, the epitaxial layer 12 is formed on the n+ type semiconductor substrate 11 by an epitaxial growth. The gate trench 13 is formed to a surface 12a of the epitaxial layer so that a bottom of the gate trench 13 reaches to the epitaxial layer 12. The gate insulator 14 is formed inside the gate trench 13. The polysilicon 15 is buried in the gate trench 13 with the gate insulator 14 interposed therebetween. The surface of the polysilicon 15 is positioned at a lower portion than the surface of the epitaxial layer 12a. The HTO film 16 is formed over the polysilicon 15 and the surface 12a of the n– type epitaxial layer. At this time, as shown in FIG. 2, p type of impurity is implanted to the surface of the epitaxial layer 12a through the HTO film 16 to form the p type diffused base layer 17. In the same way, n type of impurity is implanted to a predetermined portion of the p type diffused base layer 17 through the HTO film 16. Hence, the n+ type diffused source layer 18 is formed beside the aperture of the gate trench 13.

Figure 3:
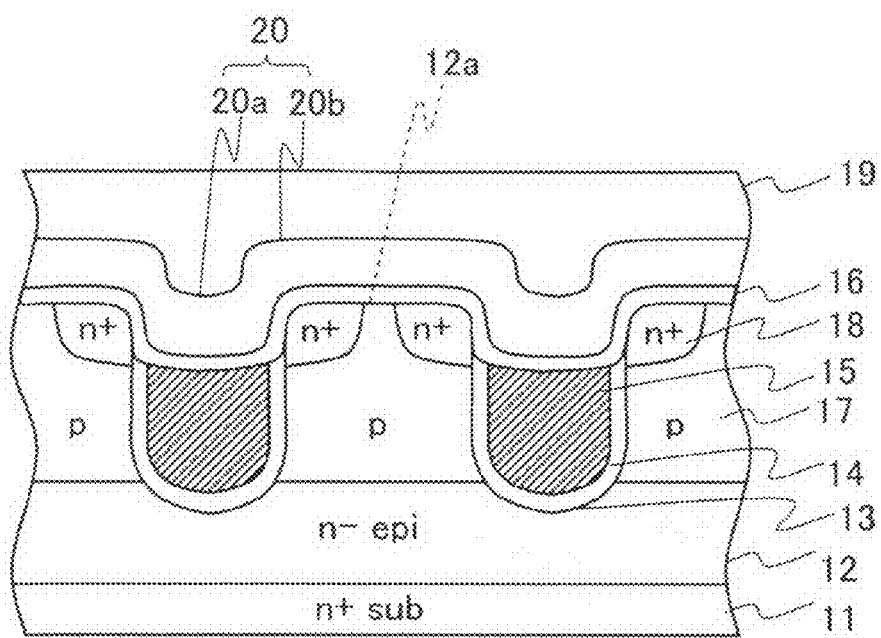
FIG. 3 shows the second process of forming the semiconductor device 10.

Next, as shown in FIG. 3, the CVD oxide film 20 is formed on the HTO film 16. At this time, the CVD oxide film 20 is formed along a shape of lower layer. Hence, a CVD oxide film 20a located above the gate trench 13 is deposited with lower position than a CVD oxide film 20b located above the surface of the epitaxial layer 12a. The BPSG having a flowability is deposited on the CVD oxide film 20. A surface of the deposited BPSG film 19 has an asperity along a surface (20a, 20b) of the CVD oxide film 20 below the BPSG film 19 (not shown).

At this time, a heat treating is performed to planarize the BPSG film 19, as shown in FIG. 3. This process of heat treating combines the process to diffuse the n+ diffused source layer 18 injected by ion implantation so that the n+ source layer 18 is diffused as high as the polysilicon 15. This is for cutting the number of the processes. An etch-back process is performed to the surface of the BPSG film 19 until the surface of CVD oxide film 20 is positioned as high as around the aperture of the gate trench 13. Hence, the semiconductor device 10 is formed as shown in FIG. 1. The BPSG film 19 is used for planarization the surface of the CVD oxide film 20 and the HTO film 16 which are not flat as shown in FIG. 1.

For the semiconductor device formed in this way, the CVD oxide film 20 (as shown in FIG. 3) formed below the BPSG film 19 can prevent boron and phosphorus of the BPSG film 19 from diffusing to the semiconductor layer (such as p base layer 17, the n+ diffused source layer 18 and the n– epitaxial layer 12). Hence, the n+ diffused source layer 18 is diffused adequately by the heat treating. Concurrently, it can reduce the diffusion of boron and phosphorus the BPSG film 19 includes to the semiconductor layer. As a result, it can enhance a controllability of manufacturing the semiconductor device 10.

It is necessary to set a thickness t of the CVD oxide film 20, so that the CVD oxide film 20 prevent adequately boron and phosphorus of the BPSG film 19 from diffusing to the semiconductor layer. At a high temperature treatment where process temperature is from 900 to 1100 degree Celsius, a diffusion coefficient of phosphorus is larger than a diffusion coefficient of boron. Hence, it may determine the thickness t of the CVD oxide film 20 considering the diffusion coefficient of phosphorus and production tolerance. Here, phosphorus concentration of the BPSG film 19 is about from 3 to 5 mol % and boron concentration of the BPSG film 19 is about from 10 to 11 mol %. A diffusion coefficient of phosphorus in $SiO_2$ is about $1 \times 10^{-14}$ ($cm^2$/sec) at 1000 degree Celsius. A diffusion coefficient of phosphorus in Si is about $5 \times 10^{-13}$ ($cm^2$/sec) at 1000 degree Celsius. A diffusion coefficient of phosphorus in Si at 1000 degree Celsius is about fiftyfold of in $SiO_2$.

On the other hand, in analysis of SIMS (Secondary Ionization Mass Spectrometer), a depth of phosphorus diffusion in Si after 30 minutes of the heat processing at 1000 degree Celsius is about 1.0 µm. Based on the result in this analysis, it is estimated that a depth of phosphorus diffusion in $SiO_2$ after 30 minutes of the heat processing at 1000 degree Celsius is about 200 angstrom that is one-fifty of the depth of phosphorus diffusion in Si. As described above, it is estimated that the preferable thickness t of the CVD oxide film 20 is more than 200 angstrom at 1000 degree Celsius of the heat processing. A listing as below shows an estimated preferable minimum film thickness t of the CVD oxide film 20 at 900, 950, 1000 and 1100 degree Celsius estimated in the same way described above.

| TEMPERATURE AT HEAT TREATMENT | FILM THICKNESS t |
| --- | --- |
| no more than 900 degree Celcius | t > 24 angstrom |
| no more than 950 degree Celcius | t > 80 angstrom |
| no more than 1000 degree Celcius | t > 200 angstrom |
| no more than 1100 degree Celcius | t > 1200 angstrom |

Figure 4:
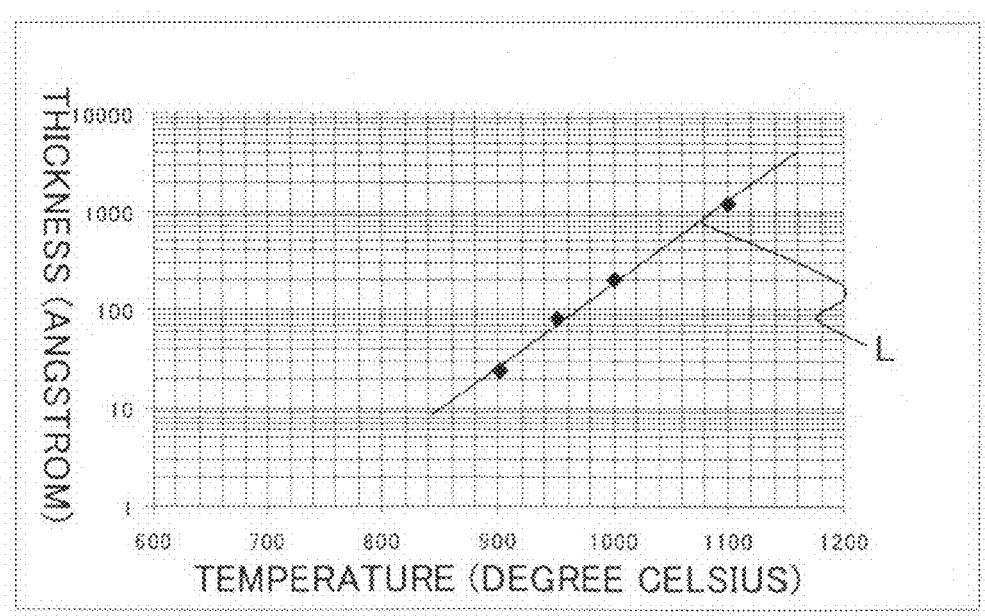
FIG. 4 shows a relationship between temperature (degree Celsius) at a heat treatment and a minimum film thickness t (angstrom)

FIG. 4 shows a relation between temperature (degree Celsius) of the heat process and minimum film thickness t of the CVD oxide film 20. The data of the relation between temperature at the heat process and minimum film thickness in the listing above is plotted on a semi-logarithmic graph. This plotted data is approximated by expression line L. Based on the graph in FIG. 4, the thickness t of the CVD oxide film 20 can be set more than the value of expression line L for processing temperature after forming the BPSG film 19. Furthermore, considering an embeddability, cost of manufacturing, variation of etching process to remove the CVD oxide film 20, the preferable thickness t of the CVD oxide film 20 is 24-10000 angstrom.

In the first embodiment, an n channel type of UMOSFET is explained for example, but this invention can be applied to a p type of UMOSFET. Applied to a p type of UMOSFET, advantages of this invention can be obtained. When this embodiment is applied to the p type of UMOSFET, conductivity type of semiconductor device in FIG. 1 is inverted.

Second Embodiment

Figure 5:
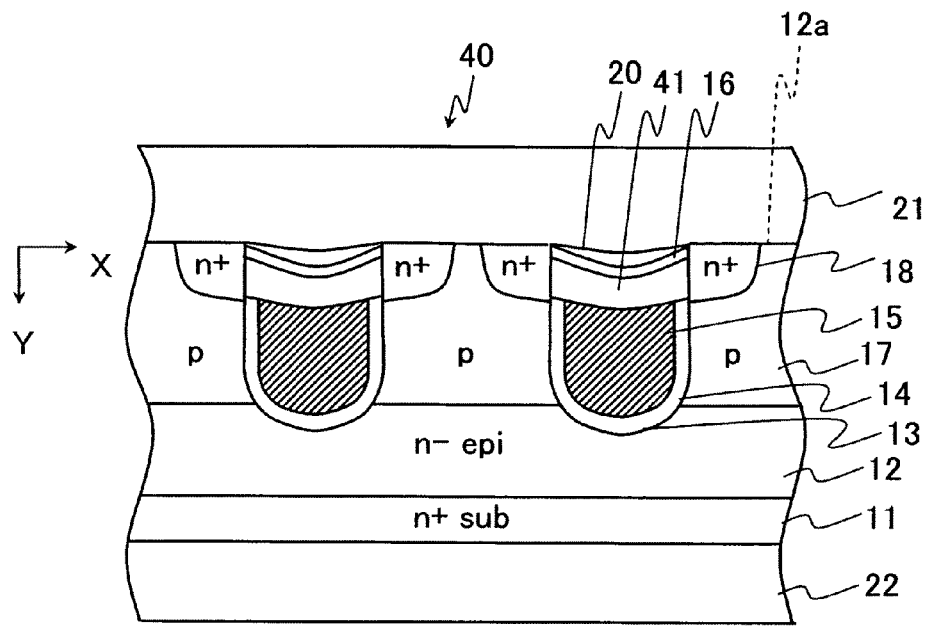
FIG. 5 shows a cross sectional view of the semiconductor device 40 according to a second embodiment.

FIG. 5 shows a cross sectional diagram of semiconductor device 40 according to a second embodiment of this invention. One feature of the second embodiment is that an NSG film 41 (None-doped Silicate Glass film) (a third oxide film) is formed below the HTO oxide film 16. Hereinafter, the same number is given to the same composition as the first embodiment.

As shown in FIG. 5, the semiconductor device 40 comprises the n+ type semiconductor substrate 11. The n- type epitaxial layer 12 is formed on the n+ type semiconductor substrate 11. The p type diffused base layer 17 is formed on the n- epitaxial layer 12. The gate trench 13 is formed at the surface of the p type diffused base layer 17. A plurality of the gate trenches 13 are formed in the X direction. The gate insulator 14 is formed on the sidewall of the gate trench 13. The polysilicon 15 is formed on the gate insulator 14.

An NSG film 41 is formed on the polysilicon 15 in the gate trench 13. A dielectric strength of the NSG film 41 is as strong as the CVD oxide film, and the NSG film 41 has a reflowability. Hence, the NSG film 41 is preferable material for an interlayer insulator formed in the gate trench 13. The HTO film 16 is formed on the NSG film 41 in the gate trench 13. The CVD oxide film 20 is formed on the HTO film 16 so as to reach the aperture portion of the gate trench 13. The n+ diffused layer 18 is formed beside the aperture of the gate trench 13.

Figure 6:
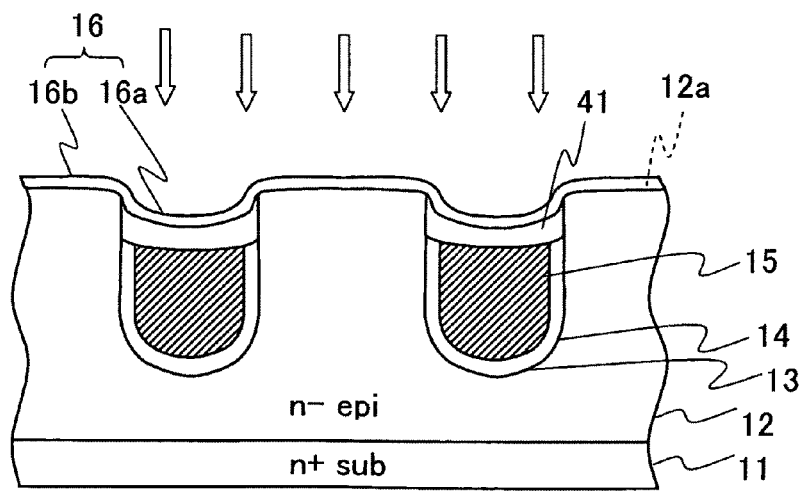
FIG. 6 shows the first process of forming the semiconductor device 40.

Next, a manufacturing method of the semiconductor device 40 configured as above is described hereinafter. FIG. 6 shows the first manufacturing process of the semiconductor device 40. First, the epitaxial layer 12 is formed on the n+ semiconductor substrate 11 by the epitaxial growth. A plurality of the gate trenches 13 are formed in the X direction so that the bottom of the gate trench 13 reaches the epitaxial layer 12. The gate insulator 14 is formed on an inner aspect of the gate trench 13. The polysilicon 15 is formed on an inner aspect of the gate insulator 14. The NSG film 41 is deposited to the polysilicon 15. Here, the NSG film 41 is formed in the gate trench 13, and not on the surface 12a of the epitaxial layer. The HTO film 16 is deposited on the NSG film 41 and the epitaxial layer 12. At this state, an impurity is implanted to the n- epitaxial layer 12 through the HTO film 16 so that p diffused base layer 17 and the n+ diffused source layer 18 are formed in the n- epitaxial layer 12.

Figure 7:
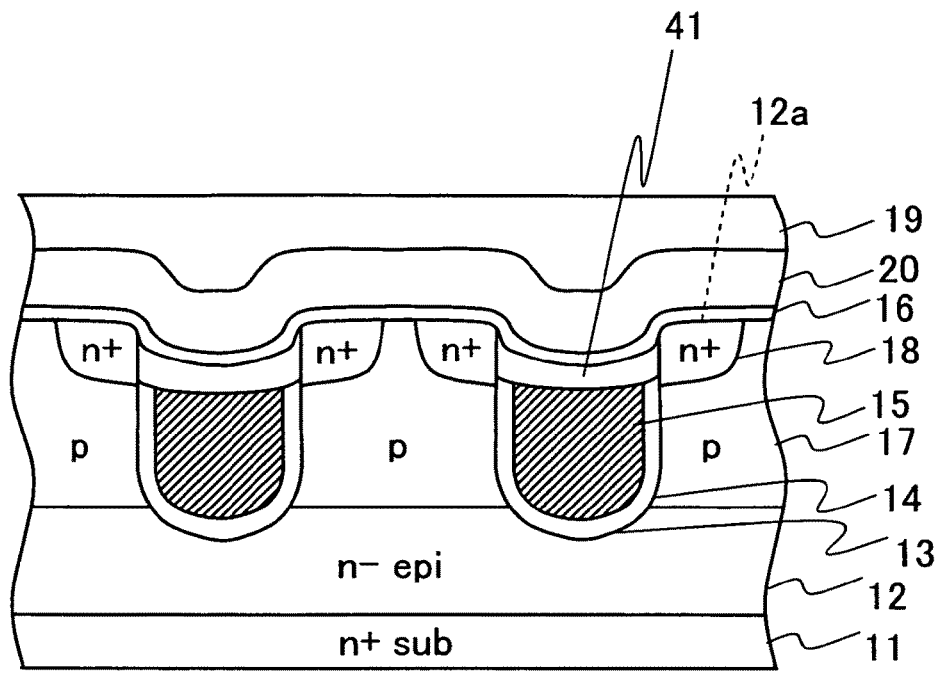
FIG. 7 shows the second process of forming the semiconductor device 40.

As shown in FIG. 7, the CVD oxide film 20 is formed on the HTO film 16. The BPSG film 19 is deposited on the CVD oxide film 20. As described above, after depositing the BPSG film 19, the surface of the BPSG film 19 has the ragged asperity along the surface of the BPSG film 19 (not shown). With the high heat processing, the ragged surface of the BPSG film 19 having a reflowability is planarized. An etch-back process is performed to the planarized surface of BPSG film 19 until the surface of CVD oxide film 20 is positioned as high as around the aperture of the gate trench 13. So, the BPSG film 19, the CVD oxide film 20 and the HTO film 16 on the epitaxial layer 12 are removed. In this way, the semiconductor device 40 as shown in FIG. 5 is formed. The source electrode 21 and the drain electrode 22 are formed as same as the first embodiment.

In the semiconductor device 40 configured as above, as the NSG film 41 is formed between the HTO film 16 and the polysilicon 15, the gap between the HTO film 16a on the gate trench 13 and the HTO film 16b on the surface 12a of epitaxial layer is less than the first embodiment (see FIG. 6). Hence, at the process of forming the p type diffused base layer 17 and the n+ type diffused source layer 18, it can prevent an impurity from diffusing through the sidewall of the gate trench 13. As a result, it can prevent the n+ type diffused layer 18 from entering in deeply around the sidewall of the gate trench 13. So, in the second embodiment, an effect of punch-through phenomena can be reduced more effectively than the first embodiment. Punch-through phenomena become prominent as gate length is shorter. As a result, it can further improve performance of the semiconductor.

For the semiconductor device 10 according to the first embodiment as shown in FIG. 1 and the semiconductor device 40 according to the second embodiment, the BPSG film 19 formed in the process of manufacturing is wholly removed by etching. But, this is the case that the thickness of the HTO film 16 and the CVD oxide film 20 are correctly formed and the etch-back process is performed with required accuracy. However, even when the formed BPSG film 19 is not wholly removed, an advantage of this invention to prevent boron and phosphorus from diffusing from the BPSG film 19 can be obtained.

Figure 8:
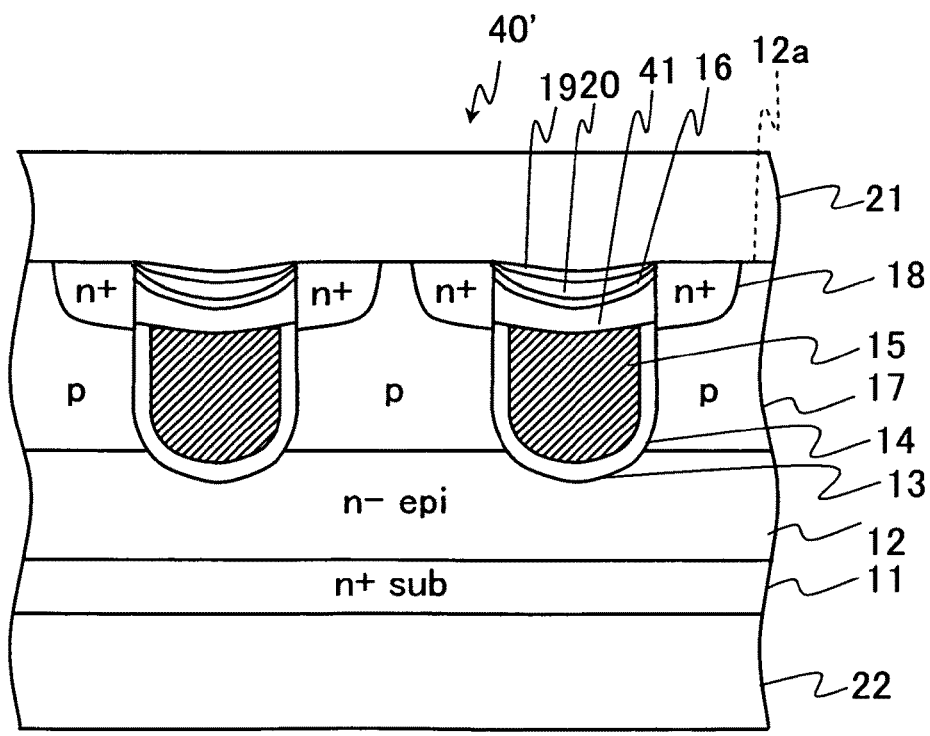
FIG. 8 shows a cross sectional view of another semiconductor device 40' according to the second embodiment.
Figure 9:
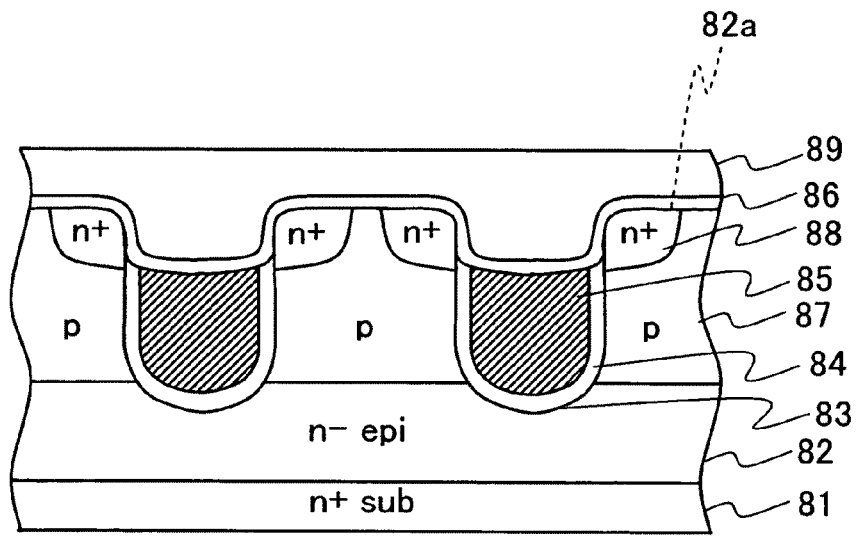
FIG. 9 shows the first process of the related forming process of the semiconductor device.
Figure 10:
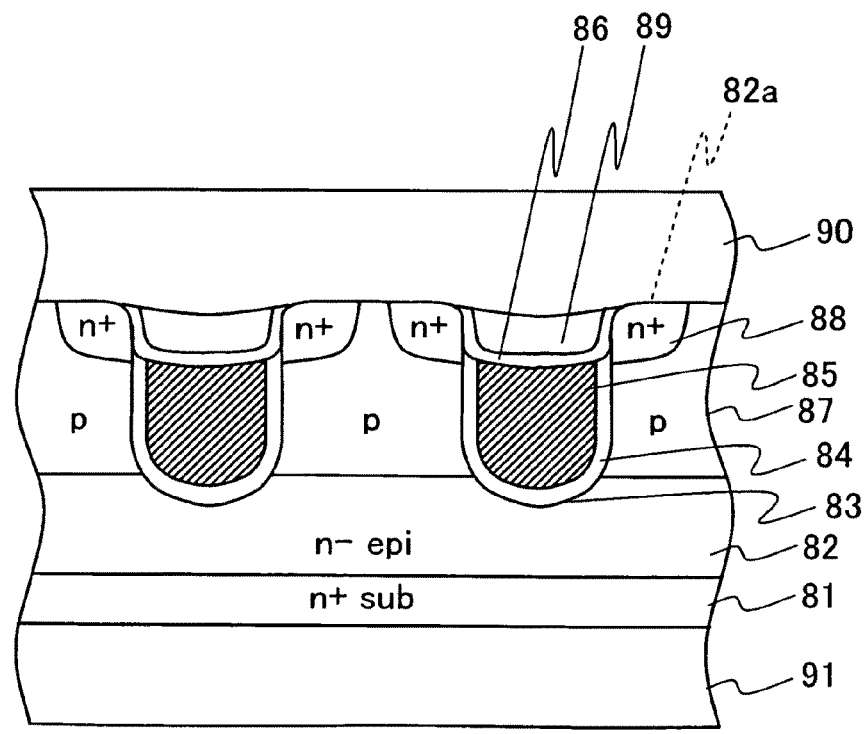
FIG. 10 shows the second process of the related forming process of the semiconductor device.

FIG. 8 shows a semiconductor device 40' according the second embodiment in the case the BPSG film 19 is not wholly removed. This semiconductor device 40' has the remained BPSG film 19 on the CVD oxide film 20. In this semiconductor device 40', even if the etch-back process is excessively performed to the NSG film 41 at the manufacturing process of the second embodiment, the thickness of interlayer insulator is enough ensured. Because the CVD oxide 20, the HTO film 16, the NSG film 41, and the BPSG film 19 are layered on the gate trench 13. Herewith, it can reduce tolerance for etching, and ensure the thickness of the interlayer insulator adequately. As a result, it can diffuse the n+ type diffused source layer 18 to reach the required depth by the heat treatment, and at the time it can restrain diffusing of the impurity. As a result, it can improve performance of UMOS-FET having interlayer insulator wholly formed in the gate trench.

The case is described that the BPSG film 19 is remained in the second embodiment, but even if the BPSG film 19 may remain in the first embodiment, the advantage of this invention can be obtained also. Material of an oxide film (as the HTO film 16, the CVD film 20, the NSG film and the like) is not limited that. A variety of material can be applied to the oxide film.

It is apparent that the present invention is not limited to the above embodiments, but may be modified and changed without departing from the scope and spirit of the invention.

What is claimed is:

1. A semiconductor device, comprising:
   a semiconductor layer of a second conductive type;
   a first diffused region of a first conductive type formed in the semiconductor layer;
   a second diffused region of the second conductive type selectively formed in the first diffused region;
   a trench formed in the semiconductor layer;
   a polysilicon formed in the trench with an insulator intervening;
   a first oxide film formed on the polysilicon so that the first oxide film is buried in the trench;
   a second oxide film formed on the first oxide film so that the second oxide film is buried in the trench; and
   a flowable insulator film formed on the second oxide film so that the flowable insulator film is buried in the trench, the flowable insulator film comprising a material different from a material of the second oxide film.

2. The semiconductor device according to claim 1, further comprising a third oxide film formed between the polysilicon and the first oxide film so that the third oxide film is buried in the trench.

3. The semiconductor device according to claim 1, wherein a thickness of the second oxide film is from 24 angstroms to 10000 angstroms.

4. The semiconductor device according to claim 1, wherein the second oxide film comprises a chemical vapor deposition (CVD) film.

5. The semiconductor device according to claim 1, wherein the first oxide film comprises a high temperature oxide (HTO) film.

6. The semiconductor device according to claim 2, wherein the third oxide film comprises a non-doped silicate glass (NSG) film.

7. The semiconductor device according to claim 1, wherein the flowable insulator film comprises a boron phosphorus silicate glass (BPSG) film.

8. The semiconductor device according to claim 1, wherein a thickness of the second oxide film is from 200 angstroms to 1200 angstroms.

9. The semiconductor device according to claim 1, wherein the first oxide film is disposed between the polysilicon and the second oxide layer.

10. The semiconductor device according to claim 9, further comprising a third oxide film formed between the polysilicon and the first oxide film so that the third oxide film is buried in the trench.

11. The semiconductor device according to claim 1, wherein the second oxide film and the flowable insulator film comprise separate layers from each other.

12. The semiconductor device according to claim 1, further comprising a source electrode disposed on the flowable insulator film, such that the flowable insulator film is disposed between the source electrode and the second oxide film.

13. The semiconductor device according to claim 1, wherein a surface of the flowable insulator film comprises an asperity along a surface of the second oxide film.

14. The semiconductor device according to claim 1, wherein the second oxide film comprises $SiO_2$.

15. A semiconductor device, comprising:
    a semiconductor layer of a second conductive type;
    a first diffused region of a first conductive type formed in the semiconductor layer;
    a second diffused region of the second conductive type selectively formed in the first diffused region;
    a trench formed in the semiconductor layer;
    a polysilicon formed in the trench with an insulator intervening;
    a high temperature oxide (HTO) film formed on the polysilicon so that the HTO film is buried in the trench;
    a chemical vapor deposition (CVD) oxide film formed on the HTO film so that the CVD film is buried in the trench; and
    a boron phosphorus silicate glass (BPSG) film formed on the CVD film so that the BPSG film is buried in the trench, the BPSG film comprising a material different from a material of the CVD film.

16. The semiconductor device according to claim 15, further comprising:
    a non-doped silicate glass (NSG) film formed between the polysilicon and the HTO film so that the NSG film is buried in the trench.

17. A semiconductor device, comprising:
    a semiconductor layer of a second conductive type;
    a first diffused region of a first conductive type formed in the semiconductor layer;
    a second diffused region of the second conductive type selectively formed in the first diffused region;
    a trench formed in the semiconductor layer;
    a polysilicon formed in the trench with an insulator intervening;
    a first oxide film formed on the polysilicon so that the first oxide film is buried in the trench;
    a second oxide film formed on the first oxide film so that the second oxide film is buried in the trench; and
    a flowable insulator film formed on the second oxide film so that the flowable insulator film is buried in the trench,
    wherein the first oxide film is disposed between the polysilicon and the second oxide film, and the second oxide film is disposed between the first oxide film and the flowable insulator film, so that the polysilicon and the flowable insulator film are intervened by the first and second oxide films therebetween.

18. The semiconductor device according to claim 17, wherein the first oxide film comprises a high temperature oxide (HTO) film, and the second oxide film comprises a chemical vapor deposition (CVD) film.

19. The semiconductor device according to claim 17, further comprising a third oxide film disposed between the polysilicon and the first oxide film, so that the polysilicon and the flowable insulator film are intervened by the third, first and second oxide films therebetween.

20. The semiconductor device according to claim 19, wherein the third oxide film comprises a non-doped silicate glass (NSG) film.

* * * * *